(12) United States Patent
Sohn et al.

(10) Patent No.: US 11,677,030 B2
(45) Date of Patent: Jun. 13, 2023

(54) THIN-FILM TRANSISTOR SUBSTRATE AND DISPLAY APPARATUS COMPRISING THE SAME

(71) Applicant: Samsung Display Co., Ltd., Yongin-si (KR)

(72) Inventors: Sangwoo Sohn, Yongin-si (KR); Yeonkeon Moon, Yongin-si (KR); Myounghwa Kim, Yongin-si (KR); Taesang Kim, Yongin-si (KR); Geunchul Park, Yongin-si (KR); Joonseok Park, Yongin-si (KR); Junhyung Lim, Yongin-si (KR); Hyelim Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 30 days.

(21) Appl. No.: 17/158,824

(22) Filed: Jan. 26, 2021

(65) Prior Publication Data
US 2021/0408292 A1 Dec. 30, 2021

(30) Foreign Application Priority Data
Jun. 26, 2020 (KR) .......................... 10-2020-0078819

(51) Int. Cl.
*H01L 29/786* (2006.01)
*H01L 27/32* (2006.01)
(Continued)

(52) U.S. Cl.
CPC .. *H01L 29/7869* (2013.01); *H01L 21/823412* (2013.01); *H01L 27/1222* (2013.01);
(Continued)

(58) Field of Classification Search
CPC ......... H01L 21/8234; H01L 21/823412; H01L 21/823807; H01L 27/1214; H01L 27/1225;
(Continued)

(56) References Cited

U.S. PATENT DOCUMENTS

| 9,153,699 | B2 | 10/2015 | Yamazaki |
| 10,483,404 | B2 | 11/2019 | Yamazaki |

(Continued)

FOREIGN PATENT DOCUMENTS

| KR | 10-1372734 B1 | 3/2014 |
| KR | 10-2015-0142374 A | 12/2015 |
| KR | 10-1833951 B1 | 4/2018 |

OTHER PUBLICATIONS

Chen, Rongsheng, et al., "Self-aligned top-gate InGaZnO thin film transistors using $SiO_2/Al_2O_3$ stack gate dielectric," Thin Solid Films, vol. 548, 2013, pp. 572-575.

*Primary Examiner* — Cheung Lee
(74) *Attorney, Agent, or Firm* — Lewis Roca Rothgerber Christie LLP

(57) ABSTRACT

A thin-film transistor substrate includes: an active layer on a substrate, the active layer including: a first semiconductor material layer; a conductor layer on the first semiconductor material layer, and including a metal element; and a second semiconductor material layer on the conductor layer; a gate insulating layer on the active layer; and a gate electrode on the gate insulating layer, and at least partially overlapping with the active layer.

20 Claims, 9 Drawing Sheets

(51) Int. Cl.
*H01L 29/24* (2006.01)
*H01L 27/12* (2006.01)
*H01L 21/8234* (2006.01)

(52) U.S. Cl.
CPC ...... *H01L 27/1225* (2013.01); *H01L 27/3244* (2013.01); *H01L 29/24* (2013.01); *H01L 29/78696* (2013.01); *H01L 27/3262* (2013.01)

(58) Field of Classification Search
CPC . H01L 27/3244; H01L 27/3248; H01L 29/24; H01L 29/4908; H01L 29/772; H01L 29/78; H01L 29/786; H01L 29/7869; H01L 29/78696; H01L 27/1222; H01L 27/3262
See application file for complete search history.

(56) References Cited

U.S. PATENT DOCUMENTS

| | | | |
|---|---|---|---|
| 2011/0315980 A1 | 12/2011 | Kim | |
| 2014/0159037 A1* | 6/2014 | Kwon | G02F 1/1368 257/43 |
| 2014/0291669 A1* | 10/2014 | Ji | H01L 29/4908 257/43 |

* cited by examiner

THIN-FILM TRANSISTOR SUBSTRATE AND DISPLAY APPARATUS COMPRISING THE SAME

CROSS-REFERENCE TO RELATED APPLICATION

This application claims priority to and the benefit of Korean Patent Application No. 10-2020-0078819, filed on Jun. 26, 2020, in the Korean Intellectual Property Office, the entire disclosure of which is incorporated by reference herein.

BACKGROUND

1. Field

Aspects of one or more embodiments relate to a thin-film transistor substrate, and a display apparatus including the same.

2. Description of the Related Art

Display apparatuses visually display data. Display apparatuses may be used as displays of small-sized products, for example, such as mobile phones, and/or may be used as displays of large-sized products, for example, such as televisions.

Display apparatuses include a plurality of pixels that receive electrical signals and emit light to display images to the outside. Each of the pixels includes a light-emitting element. For example, organic light-emitting display apparatuses include organic light-emitting diodes (OLEDs) as the light-emitting elements. In general, organic light-emitting display apparatuses operate with thin-film transistors and organic light-emitting diodes that are formed on a substrate, and the organic light-emitting diodes may be self-emitting (e.g., may emit light by themselves).

Recently, as the use of display apparatuses has diversified, various designs for improving the quality of the display apparatuses have been developed.

The above information disclosed in this Background section is for enhancement of understanding of the background of the present disclosure, and therefore, it may contain information that does not constitute prior art.

SUMMARY

One or more example embodiments of the present disclosure are directed to a thin-film transistor substrate in which carrier mobility of a thin-film transistor is increased, and a display apparatus including the same.

However, the aspects and features of the present disclosure are not limited to the above, and additional aspects and features will be set forth in part in the description that follows, and in part, will be apparent from the detailed description, or may be learned by practicing one or more of the presented example embodiments of the present disclosure.

According to one or more example embodiments of the present disclosure, a thin-film transistor substrate includes: an active layer on a substrate, the active layer including: a first semiconductor material layer; a conductor layer on the first semiconductor material layer, and including a metal element; and a second semiconductor material layer on the conductor layer; a gate insulating layer on the active layer; and a gate electrode on the gate insulating layer, and at least partially overlapping with the active layer.

In an example embodiment, at least one of the first semiconductor material layer or the second semiconductor material layer may include an oxide semiconductor material.

In an example embodiment, the first semiconductor material layer and the second semiconductor material layer may each include at least one of an InSnZnO (ITZO) semiconductor layer, an InSnGaZnO semiconductor layer, or an InSnTiZnO semiconductor layer.

In an example embodiment, a thickness of at least one of the first semiconductor material layer or the second semiconductor material layer may be greater than a thickness of the conductor layer.

In an example embodiment, a thickness of the conductor layer may be about 30 Å to about 60 Å.

According to one or more example embodiments of the present disclosure, a display apparatus includes: a first thin-film transistor on a substrate, and including a first active layer and a first gate electrode; and a light-emitting element electrically connected to the first thin-film transistor. The first active layer includes: a first semiconductor material layer; a first conductor layer on the first semiconductor material layer, and including a metal element; and a second semiconductor material layer on the first conductor layer.

In an example embodiment, a thickness of at least one of the first semiconductor material layer or the second semiconductor material layer may be greater than a thickness of the first conductor layer.

In an example embodiment, the display apparatus may further include a second thin-film transistor on the substrate, and including a second active layer and a second gate electrode.

In an example embodiment, the second active layer may include: a third semiconductor material layer; a second conductor layer on the third semiconductor material layer, and including a metal element; and a fourth semiconductor material layer on the second conductor layer.

In an example embodiment, a thickness of at least one of the third semiconductor material layer or the fourth semiconductor material layer may be greater than a thickness of the second conductor layer.

In an example embodiment, a thickness of at least one of the first conductor layer or the second conductor layer may be about 30 Å to about 60 Å.

In an example embodiment, at least one of the first to fourth semiconductor material layers may include an oxide semiconductor material.

In an example embodiment, the first semiconductor material layer and the second semiconductor material layer may each include at least one of an ITZO semiconductor layer, an InSnGaZnO semiconductor layer, or an InSnTiZnO semiconductor layer.

In an example embodiment, the second active layer may include a single layer.

In an example embodiment, the second active layer may include a silicon semiconductor material.

In an example embodiment, the display apparatus may further include: a storage capacitor on the substrate, and including a first electrode and a second electrode that overlap with each other; and a driving voltage line electrically connected to the storage capacitor. The storage capacitor may be configured to store a voltage corresponding to a difference between a first voltage applied to the driving voltage line and a second voltage applied to the second thin-film transistor.

According to one or more example embodiments of the present disclosure, a thin-film transistor substrate includes: an active layer on a substrate, and including a semiconductor material layer, and a conductor layer that includes a metal element; a gate insulating layer on the active layer; and a gate electrode on the gate insulating layer, and at least partially overlapping with the active layer.

In an example embodiment, the conductor layer may be on the semiconductor material layer.

In an example embodiment, a thickness of the semiconductor material layer may be greater than a thickness of the conductor layer.

In an example embodiment, the semiconductor material layer may include an oxide semiconductor material.

Other aspects and features of the present disclosure, in addition to those described above, may become apparent from the following detailed description, drawings, and claims.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
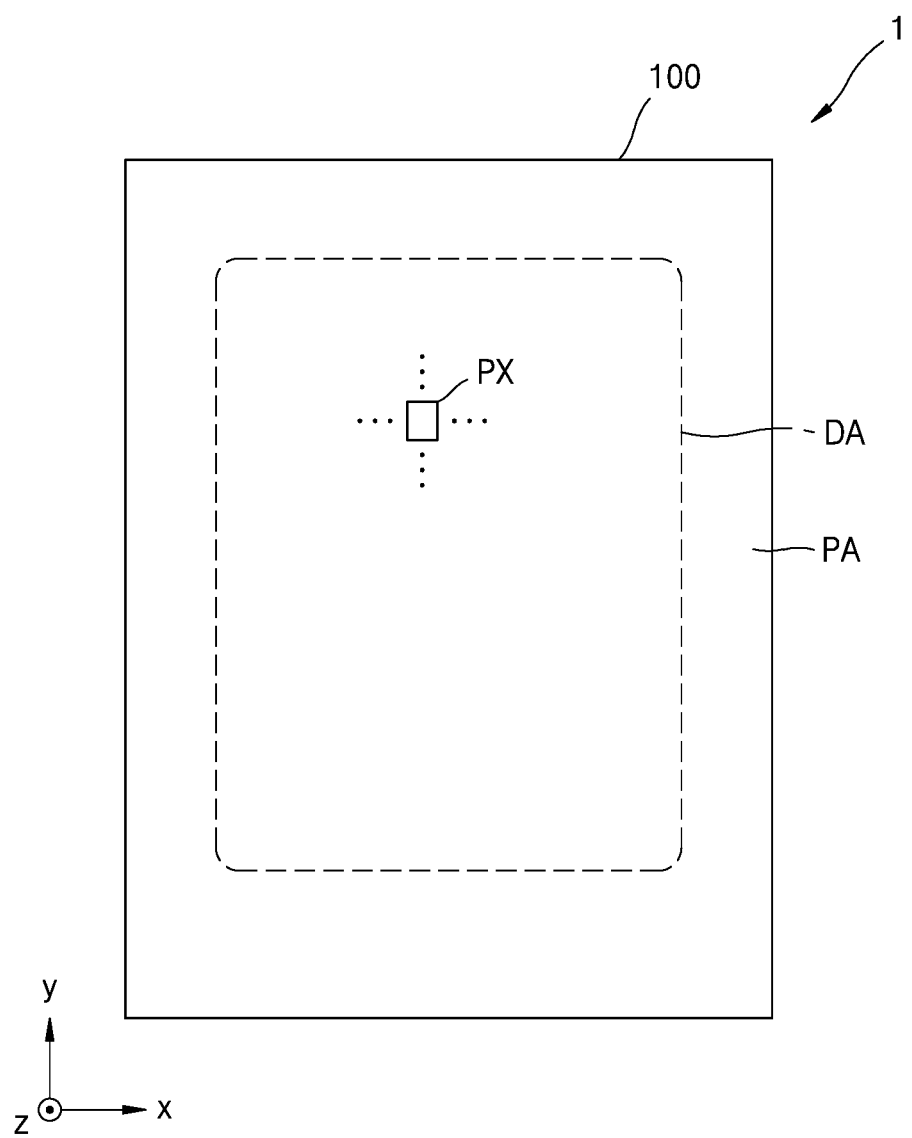
FIG. 1 is a schematic plan view of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When an embodiment may be realized differently, a specific process order may be performed differently from the described order. For example, two processes described in succession may be performed concurrently (e.g., simultaneously) or substantially concurrently, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The x-axis, the y-axis, and the z-axis shown in the figures are not limited to three axes of the rectangular coordinate system, and may be interpreted in a broader sense. For example, the x-axis, y-axis, and z-axis may be orthogonal to each other, or may refer to different directions that are not orthogonal to each other.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. For example, when layers, areas, elements, and/or the like are referred to as being "electrically connected," they may be directly electrically connected, or may be indirectly electrically connected with one or more intervening layers, areas, elements, and/or the like being present. Similarly, it will be understood that when a layer, region, or element is referred to as being "formed on," another layer, region, or element, it may be directly or indirectly formed on the other layer, region, or element. In other words, for example, one or more intervening layers, regions, or elements may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display apparatus 1 according to an embodiment.

Referring to FIG. 1, the display apparatus 1 includes a display area DA for displaying an image, and a peripheral area PA arranged around (e.g., to surround a periphery of) the display area DA. The display apparatus 1 may provide an image to the outside by using light emitted from the display area DA.

A substrate 100 may include various suitable materials, for example, such as glass, metal, and/or plastic. According to an embodiment, the substrate 100 may include a flexible material. As used herein, the flexible material may refer to a substrate that is bendable, foldable, and/or rollable (e.g., that may be easily bent, folded, and/or rolled). The substrate 100 of the flexible material may include ultra-thin glass, metal, and/or plastic.

A plurality of pixels PX including various suitable display elements, for example, such as organic light-emitting diodes (OLEDs), may be arranged at (e.g., in or on) the display area DA of the substrate 100. The plurality of pixels PX may be provided and arranged in various suitable forms, for example, such as a stripe arrangement, a diamond shaped arrangement (e.g., a PENTILE® (a registered trademark of Samsung Display Co., Ltd.) arrangement), a mosaic arrangement, and/or the like, so as to realize an image.

When the display area DA is viewed in a plan view (e.g., viewed from a plane that is parallel or substantially parallel to a top surface of the substrate 100), the display area DA may have a rectangular shape, for example, as shown in FIG. 1. In another embodiment, the planar shape of the display area DA may be provided in any suitable polygonal shape, for example, such as a triangular shape, a pentagonal shape, a hexagonal shape, and the like, a circular shape, an elliptical shape, or an irregular shape.

The peripheral area PA of the substrate 100 is arranged around (e.g., to surround a periphery of) the display area DA, and may be an area at (e.g., in or on) which an image is not displayed. Various wirings configured to transmit electrical signals to be applied to the display area DA, and pads to which a printed circuit board or driver IC chip is attached may be located at (e.g., in or on) the peripheral area PA.

Figure 2:
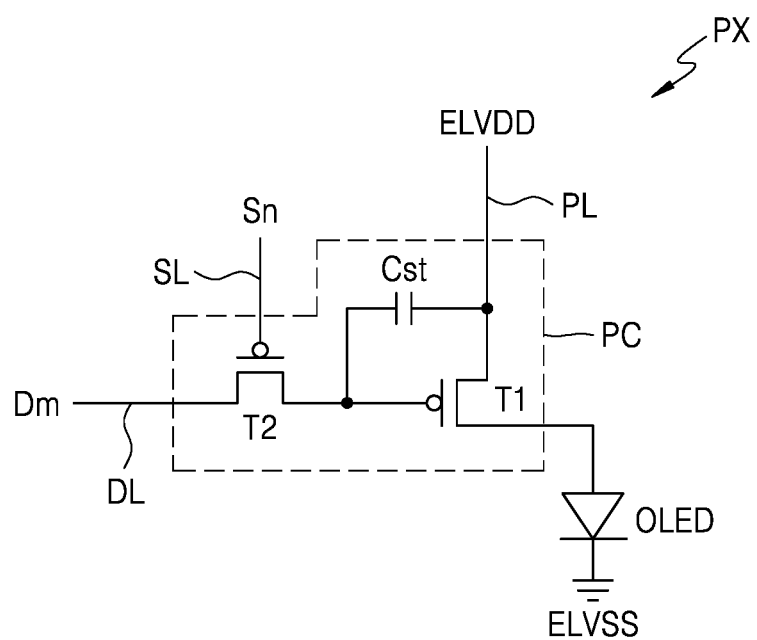
FIG. 2 is an equivalent circuit diagram of a pixel of a display apparatus according to an embodiment.

FIG. 2 is an equivalent circuit diagram of a pixel PX of the display apparatus 1 according to an embodiment.

Referring to FIG. 2, each pixel PX includes a pixel circuit PC connected to a corresponding scan line SL and a corresponding data line DL, and an organic light-emitting diode OLED connected to the pixel circuit PC.

The pixel circuit PC includes a driving thin-film transistor (TFT) T1, a switching TFT T2, and a storage capacitor Cst. The switching TFT T2 is connected to the scan line SL and the data line DL, and is configured to supply a data signal Dm received through the data line DL to the driving TFT T1 according to a scan signal Sn received through the scan line SL.

The storage capacitor Cst is connected to the switching TFT T2 and a driving voltage line PL, and stores a voltage corresponding to a difference between a voltage received from the switching TFT T2 and a driving voltage ELVDD supplied to the driving voltage line PL.

The driving TFT T1 may be connected to the driving voltage line PL and the storage capacitor Cst, and may control a driving current flowing from the driving voltage line PL to the organic light-emitting diode OLED in accordance with a voltage value stored in the storage capacitor Cst. The organic light-emitting diode OLED may emit light having a suitable or desired luminance according to the driving current.

Although FIG. 2 illustrates that the pixel circuit PC includes two TFTs and one storage capacitor, the present disclosure is not limited thereto. For example, the pixel circuit PC may include three or more TFTs and/or two or more storage capacitors. In an embodiment, the pixel circuit PC may include seven TFTs and one storage capacitor.

Figure 3A:
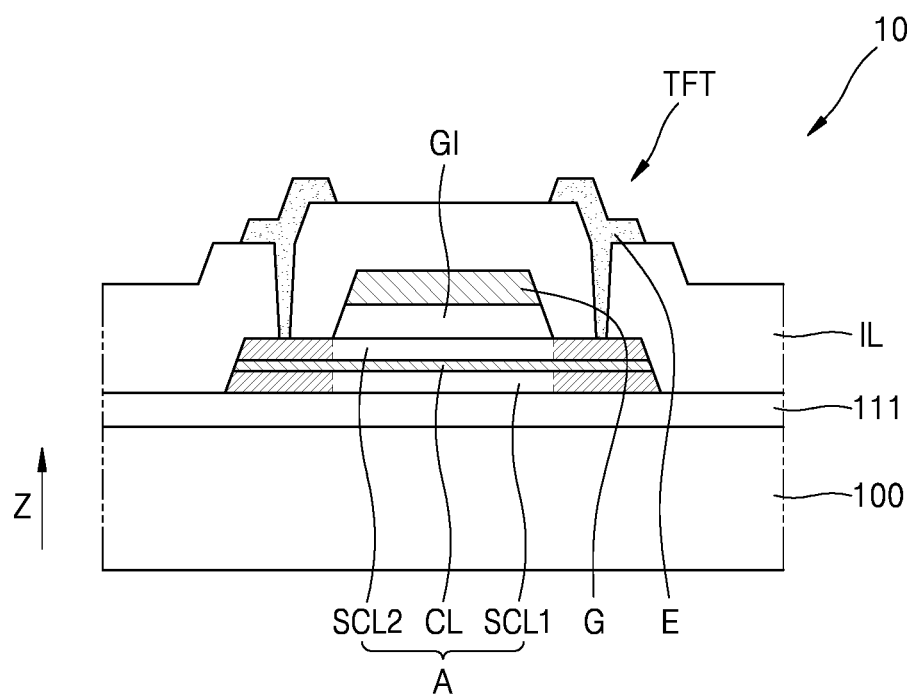
FIG. 3A is a schematic cross-sectional view of a portion of a thin-film transistor substrate according to an embodiment.
Figure 3B:
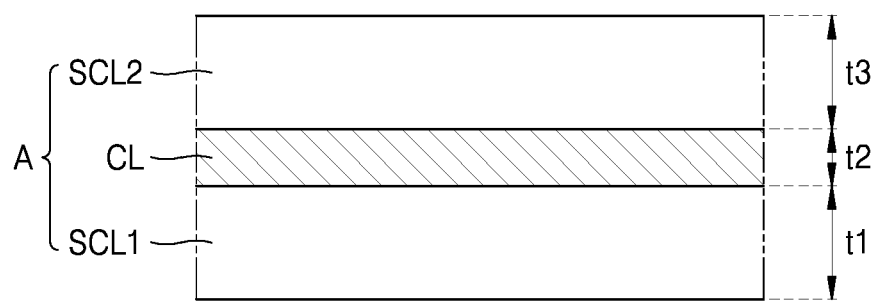
FIG. 3B is a schematic enlarged cross-sectional view of an active layer of FIG. 3A.

FIG. 3A is a schematic cross-sectional view of a portion of a thin-film transistor substrate 10 according to an embodiment, and FIG. 3B is a schematic enlarged cross-sectional view of the active layer A of FIG. 3A.

Referring to FIG. 3A, the thin-film transistor substrate 10 may include a thin-film transistor TFT including an active layer A, and a gate electrode G.

The active layer A may have a triple-layered structure. For example, the active layer A may have a triple-layered structure including a first semiconductor material layer SCL1, a conductor layer CL, and a second semiconductor material layer SCL2.

Hereinafter, a configuration included in the thin-film transistor substrate 10 will be described in more detail according to a stacking order with reference to FIG. 3A.

The substrate 100 may include a glass material, a ceramic material, a metallic material, and/or a flexible or bendable material. When the substrate 100 is flexible or bendable, the substrate 100 may include a polymer resin, for example, such as polyethersulfone, polyacrylate, polyetherimide, polyethylene naphthalate, polyethyelene terephthalate, polyphenylene sulfide, polyarylate, polyimide, polycarbonate, or cellulose acetate propionate.

The substrate 100 may have a single-layer structure or a multi-layered structure including one or more of the above-described materials. In the case of the multi-layered structure, the substrate 100 may further include an inorganic layer. In some embodiments, the substrate 100 may have a structure (e.g., a stacked structure) including an organic material/inorganic material/organic material.

A buffer layer 111 may be located on the substrate 100, and may reduce or block the penetration of foreign matter, moisture, and/or external air from a lower portion of the substrate 100. The buffer layer 111 may provide a flat or substantially flat surface on the substrate 100. The buffer layer 111 may include an inorganic material, for example, such as an oxide or a nitride, an organic material, or an organic-inorganic composite, and may have a single-layer structure or a multi-layered structure including an inorganic material and an organic material.

In some embodiments, a barrier layer may be further included between the substrate 100 and the buffer layer 111. The barrier layer may serve to prevent or reduce (e.g., to significantly reduce) penetration of impurities from the substrate 100 and/or the like into the active layer A. The barrier layer may include an inorganic material, for example, such as an oxide or a nitride, an organic material, or an organic-inorganic composite, and may have a single-layer structure or a multi-layered structure including an inorganic material and an organic material.

The active layer A may be located on the buffer layer 111. The active layer A may include the first semiconductor material layer SCL1, the conductor layer CL, and the second semiconductor material layer SCL2. The active layer A may have a structure (e.g., a stacked structure) of a semiconductor layer/conductor layer/semiconductor layer.

The first and second semiconductor material layers SCL1 and SCL2 may each include an oxide semiconductor material. For example, the first and second semiconductor material layers SCL1 and SCL2 may each include an oxide of at least one material selected from the group consisting of indium (In), gallium (Ga), stannium (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). As an example, the first and second semiconductor material layers SCL1 and SCL2 may be an InSnZnO (ITZO) semiconductor layer, an InGaZnO (IGZO) semiconductor layer, or the like.

As another example, the first and second semiconductor material layers SCL1 and SCL2 may each include a material denoted by $M1_aM2_bM3_cM4_dO_x$. Here, M1 may be In, M2 may be Sn, M4 may be Zn, and M3 may be Ga, Mg, Hf, or Ti having a high binding energy with oxygen. b may be a real number between 0 and 5, a, c, and d may each be a real number between 0 and 2, and x may be any suitable real number. For example, the first and second semiconductor material layers SCL1 and SCL2 may each be an ITZO semiconductor layer, an InSnGaZnO semiconductor layer, an InSnTiZnO semiconductor layer, or the like.

The conductor layer CL may be between the first and second semiconductor material layers SCL1 and SCL2. The conductor layer CL may include a metal element, for example, such as Al, platinum (Pt), palladium (Pd), silver (Ag), magnesium (Mg), gold (Au), nickel (Ni), neodymium (Nd), iridium (Ir), Cr, lithium (Li), calcium (Ca), molybdenum (Mo), Ti, tungsten (W), copper (Cu), niobium (Nb), and/or the like. The conductor layer CL may include a metal or a metal compound having a suitable resistance (e.g., a predetermined resistance) of about 350 μΩcm to about 990 μΩcm. As an example, the conductor layer CL may include titanium nitride (TiN), Nb, or the like.

The first semiconductor material layer SCL1 may be arranged under (e.g., underneath) the conductor layer CL to protect the conductor layer CL from being unevenly formed due to a surface roughness of the substrate 100 or the buffer layer 111. The second semiconductor material layer SCL2 may be arranged on the conductor layer CL to prevent or substantially prevent the conductor layer CL, through which a current flows, from being connected to other metal layers. The first semiconductor material layer SCL1 may also prevent or substantially prevent an unexpected current from flowing through the conductor layer CL due to the conductor layer CL being connected to other metal layers.

In an embodiment, as shown in FIG. 3B, the first semiconductor material layer SCL1 and the conductor layer CL may have different thicknesses from each other. A thickness t1 of the first semiconductor material layer SCL1 may be greater than a thickness t2 of the conductor layer CL. As an example, the thickness t2 of the conductor layer CL may be about 30 Å to about 60 Å, and the thickness t1 of the first semiconductor material layer SCL1 may be about 100 Å about to 200 Å.

Although the first semiconductor material layer SCL1 has been described in more detail, the same or substantially the same description may apply to the second semiconductor material layer SCL2. For example, a thickness t3 of the second semiconductor material layer SCL2 may be greater than the thickness t2 of the conductor layer CL.

In some embodiments, a bottom metal layer may be arranged between the barrier layer and the buffer layer 111. The bottom metal layer may include a conductive material including, for example, Mo, Al, Cu, Ti, or the like, and may have a single-layer structure or a multi-layered structure including one or more of the above materials. As an example, the bottom metal layer may have a multi-layered structure of Ti/Al/Ti.

The bottom metal layer may be arranged to overlap with the active layer A. The first semiconductor material layer SCL1 and the second semiconductor material layer SCL2, each of which includes an oxide semiconductor material, of the active layer A may be vulnerable to light. In this case, the bottom metal layer may prevent or substantially prevent various element characteristics of a thin-film transistor TFT including an oxide semiconductor material from being changed due to photocurrent caused in the first semiconductor material layer SCL1 and the second semiconductor material layer SCL2 by external light incident thereto from the substrate 100.

A gate insulating layer GI may be arranged on the active layer A. The gate insulating layer GI may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

In an embodiment, as shown in FIG. 3A, the gate insulating layer GI may be patterned to overlap with portions of the first semiconductor material layer SCL1 and the second semiconductor material layer SCL2. An area of the first semiconductor material layer SCL1 and the second semiconductor material layer SCL2, which overlaps with the gate insulating layer GI, may be understood as a channel area. A source area and a drain area (e.g., corresponding to hatched areas at opposite sides of the channel area in FIG. 3A) undergo a conductorization process by plasma treatment, and/or the like. In this case, a portion (e.g., the channel area) of the first semiconductor material layer SCL1 and the second semiconductor material layer SCL2, which overlaps with the gate insulating layer GI, may not undergo plasma treatment, and thus, may have different properties from those of the source area and the drain area. In other words, by using the gate electrode G, which is located on the gate insulating layer GI, as a self-aligned mask when plasma-treating the first semiconductor material layer SCL1 and the second semiconductor material layer SCL2, the channel area, which is not plasma-treated, may be formed at a location overlapping with the gate insulating layer GI, and the source area and the drain area, which are plasma-treated, may be respectively formed at opposite sides of the channel area.

Although FIG. 3A shows that the first semiconductor material layer SCL1 and the second semiconductor material layer SCL2 each includes a channel area, a source area, and a drain area, the present disclosure is not limited thereto, and only one from among the first semiconductor material layer SCL1 and the second semiconductor material layer SCL2 may include the channel area, the source area, and the drain area depending on conditions of the conductorization process by plasma treatment, and/or the like. For example, the second semiconductor material layer SCL2 may include the channel area, the source area, and the drain area, and the first semiconductor material layer SCL1 may not include the channel area, the source area, and the drain area. In this case, a time used for conductorizing the active layer A by plasma treatment and/or the like may be relatively short (e.g., may be decreased).

As another example, the gate insulating layer GI may not be patterned to overlap with a portion of the active layer A, but may be arranged to cover an upper surface and side surfaces of the active layer A. In other words, the gate insulating layer GI may be arranged to correspond to an entire or substantially an entire surface of the substrate 100.

The gate electrode G may be arranged on the gate insulating layer GI to at least partially overlap with the active layer A. The gate electrode G may include a single layer or multi-layers of one or more metals selected from the group consisting of Al, Pt, Pd, Ag, Mg, Au, Ni, Nd, Ir, Cr, Li, Ca, Mo, Ti, W, and Cu.

The thin-film transistor TFT may include an electrode layer E arranged on an insulating layer IL, and connected to the active layer A through contact holes formed in the insulating layer IL.

The electrode layer E may include a source electrode electrically connected to the source area, and a drain electrode electrically connected to the drain area. The electrode layer E may include a single layer or multi-layers of one or more metals selected from the group consisting of Al, Pt, Pd, Ag, Mg, Au, Ni, Nd, Ir, Cr, Li, Ca, Mo, Ti, W, and Cu. In an embodiment, the electrode layer E may include a single Mo layer or multi-layers of Mo/Al/Mo. The electrode layer E may be connected to the data line DL and/or the driving voltage line PL (e.g., see FIG. 2).

The insulating layer IL may be between the gate electrode G and the electrode layer E. In other words, the insulating layer IL may be arranged to cover the gate electrode G. The insulating layer IL may include an inorganic material including an oxide or a nitride. For example, the insulating layer IL may include $SiO_2$, $SiN_x$, $SiON$, $Al_2O_3$, $TiO_2$, $Ta_2O_5$, $HfO_2$, or $ZnO_2$. In addition, the insulating layer IL may include an organic material, for example, such as acryl, benzocyclobutene (BCB), polyimide, hexamethyldisiloxane (HMDSO), or the like.

The thin-film transistor substrate 10 according to an embodiment may include a thin-film transistor TFT including an active layer A and a gate electrode G, and the active layer A may have a triple-layered structure including a first semiconductor material layer SCL1, a conductor layer CL, and a second semiconductor material layer SCL2. In this case, the active layer A may have a high carrier mobility. In addition, the thin-film transistor TFT may function as a switch by using the active layer A including the conductor layer CL. This will be described in more detail with reference to FIGS. 4 to 6.

Figure 4:
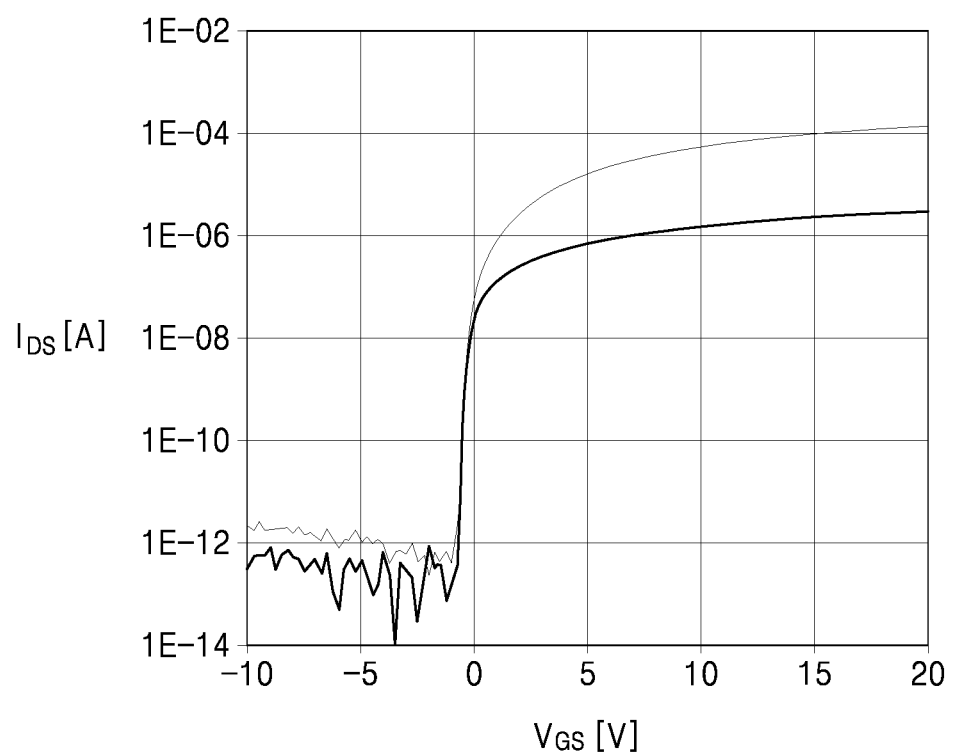
FIG. 4 is a graph representing a change in a drain-source current according to a gate-source voltage.

FIG. 4 is a graph representing a change in a drain-source current $I_{DS}$ according to a gate-source voltage VGS.

Referring to FIG. 4, in the thin-film transistor TFT including the active layer A that has a triple-layered structure including the first and second semiconductor material layers SCL1 and SCL2, which are oxide semiconductors, and the conductor layer CL, a change in the drain-source current $I_{DS}$ according to the gate-source voltage VGS is shown. In FIG. 4, a case where the first and second semiconductor material layers SCL1 and SCL2 are n-type semiconductors is shown as an example, and the same or substantially the same may apply to a case where the first and second semiconductor material layers SCL1 and SCL2 are p-type semiconductors.

When the gate-source voltage VGS has a negative value, the drain-source current $I_{DS}$ may correspond to about $1\times10^{-14}$ Å to about $1\times10^{-12}$ Å. Conversely, when the gate-source voltage VGS has a positive value, the drain-source current $I_{DS}$ may correspond to about $1\times10^{-6}$ Å to about $1\times10^{-4}$ Å. In other words, as the gate-source voltage VGS changes from a negative value to a positive value, a value of the drain-source current $I_{DS}$ increases about $10^6$ times to about $10^{10}$ times. Thus, the drain-source current $I_{DS}$ may be pumped from a low current value to a high current value. Accordingly, the thin-film transistor TFT including the active layer A having a triple-layered structure may function as a switch through the active layer A including the conductor layer CL.

As described above, even when the active layer A includes the conductor layer CL, the thin-film transistor TFT according to an embodiment may realize (e.g., may easily realize) switching characteristics of a thin-film transistor in the same or substantially the same manner as a thin-film transistor including only a semiconductor layer.

The two lines shown in FIG. 4 correspond to different drain-source voltages $V_{DS}$ for the same sample. As shown in FIG. 4, while a value of a saturated drain-source current IDs may differ according to a drain-source voltage $V_{DS}$, the thin-film transistor TFT may function as a switch.

In an embodiment, when forming the first and second semiconductor material layers SCL1 and SCL2, respectively, a process oxygen partial pressure may be about 64% to about 96%. In other words, the first and second semiconductor material layers SCL1 and SCL2 may be deposited at an oxygen gas ratio of about 64% to about 96%. As the process air partial pressure increases, oxygen vacancy in the first and second semiconductor material layers SCL1 and SCL2 decreases, and thus, conductivity of the first and second semiconductor material layers SCL1 and SCL2 also decreases.

In a case where, the process oxygen partial pressure is about 64% to about 96% when respectively forming the first and second semiconductor material layers SCL1 and SCL2, carrier concentration of the first and second semiconductor material layers SCL1 and SCL2 may be about $1.232\times10^{16}$ piece/cm³ to about $1.848\times10^{16}$ piece/cm³. Energy in the first and second semiconductor material layers SCL1 and SCL2 (where the energy refers to a difference ($E_c-E_f$) between conduction band energy ($E_c$) and Fermi energy ($E_f$)) may be about 0.12 eV to about 0.18 eV.

In this case, an on current may be about $1 \times 10^{-4}$ A, and when carrier mobility is calculated using a value of the on current, the carrier mobility of the active layer A may be about 50 cm$^2$/Vs. Here, the on current may be defined as a drain-source current IDs that is measured between about 10 to 15 seconds after a positive value is applied to the gate-source voltage $V_{GS}$.

In an embodiment, the thickness t1 of the first semiconductor material layer SCL1 may be greater than the thickness t2 of the conductor layer CL. As an example, the thickness t2 of the conductor layer CL may be about 30 Å to about 60 Å, and the thickness t1 of the first semiconductor material layer SCL1 may be about 100 Å to about 200 Å. Even in this case, the active layer A may realize a high carrier mobility of about 50 cm$^2$/Vs.

Figure 5:
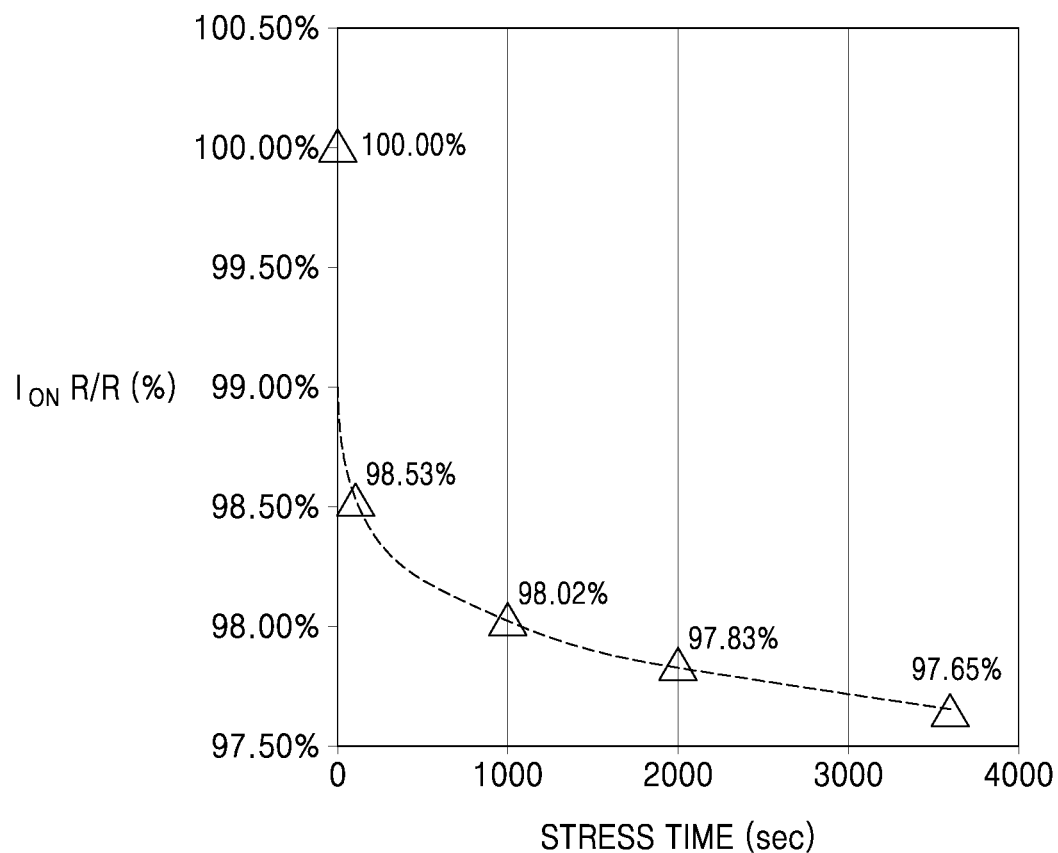
FIG. 5 is a graph representing a change in element characteristics according to an application of a drain-source voltage.

FIG. 5 is a graph representing a change in element characteristics according to application of a drain-source voltage $V_{DS}$.

Referring to FIG. 5, when a high drain-source voltage $V_{DS}$ is applied, the degree to which characteristics of the thin-film transistor TFT changes over time is shown.

As shown in FIG. 5, even though about 1000 to 2000 seconds pass after a high drain-source voltage $V_{DS}$ is applied to the thin-film transistor TFT including the active layer A including the conductor layer CL, a ratio at which the on current is maintained or substantially maintained is about 97% to about 98.5%, and thus, device characteristics may be stable. In other words, when the active layer A has a triple-layered structure including the conductor layer CL, the device characteristics may be stable.

Figure 6:
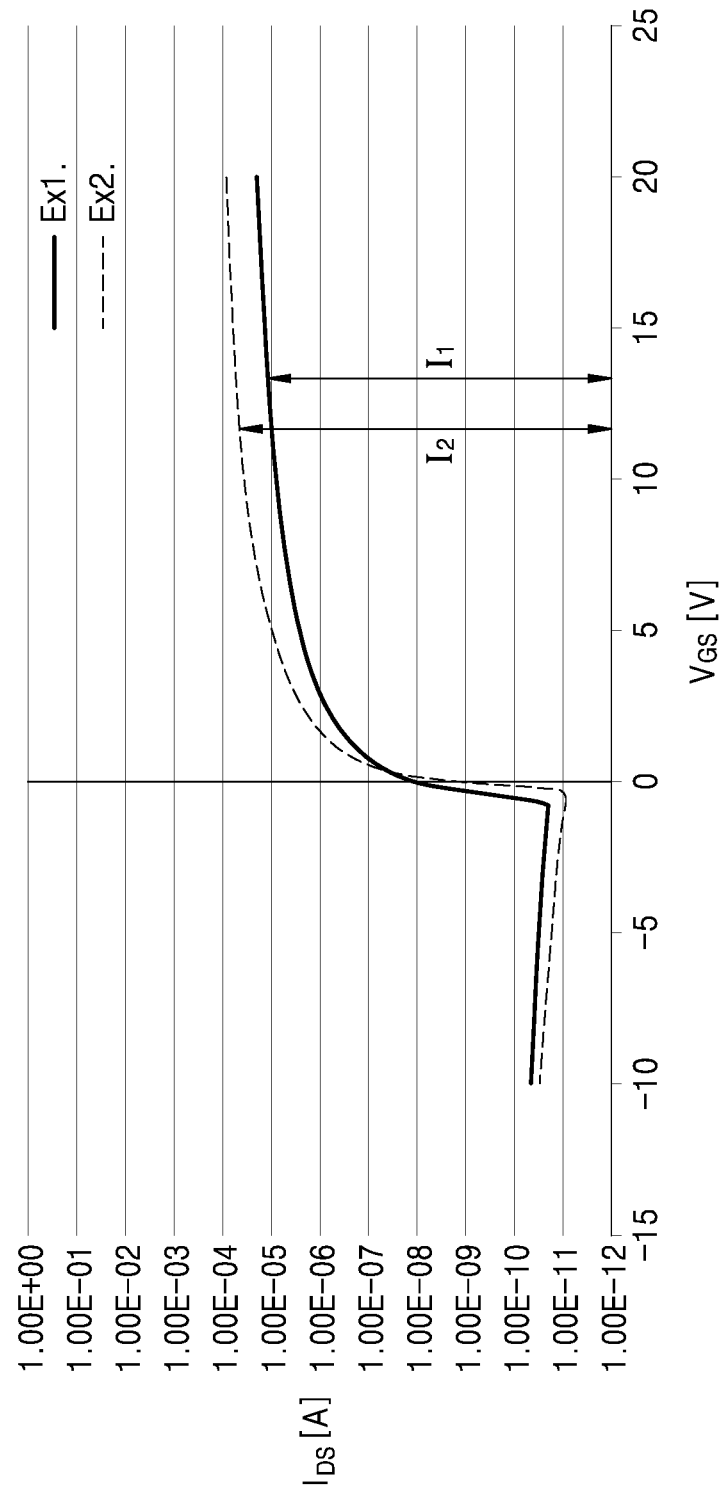
FIG. 6 is a graph representing a change in a drain-source current according to a gate-source voltage.

FIG. 6 is a graph representing a change in a drain-source current $I_{DS}$ according to a gate-source voltage $V_{GS}$.

Referring to FIG. 6, a change in a drain-source current $I_{DS}$ according to a gate-source voltage $V_{GS}$ in each of a case (Ex1.) where the active layer A has a single layer (e.g., a single-layered structure) and a case (Ex2.) where the active layer A has a triple-layered structure is shown.

An on current I1 in the case (Ex1.) where the active layer A has a single layer is about $1 \times 10^{-5}$ A, and an on current I2 in the case (Ex2.) where the active layer A has a triple-layered structure is about $1 \times 10^{-4}$ A.

Mobility is proportional to the on current. In other words, the higher the on current, the greater the mobility. Because the on currents in the case (Ex1.) where the active layer A has a single layer and the case (Ex2.) where the active layer A has a triple-layered structure are about 6 to 10 times different from each other, the mobilities in both cases may also be about 6 to 10 times different from each other. In other words, the mobility in the case (Ex2.) where the active layer A has a triple-layered structure may be about 6 to 10 times greater than the mobility in the case (Ex1.) where the active layer A has a single layer structure.

Figure 7:
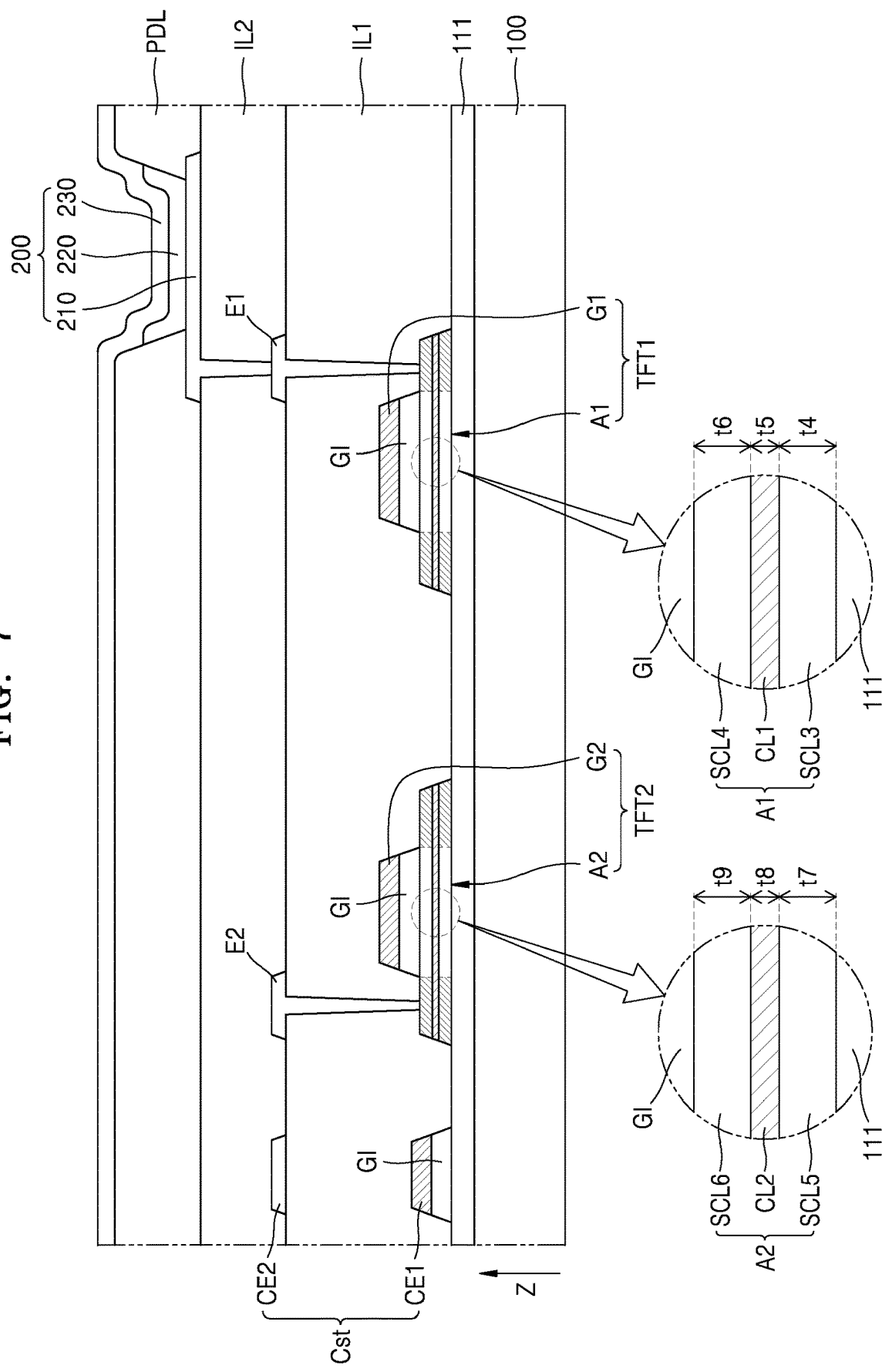
FIG. 7 is a schematic cross-sectional view of a portion of a display apparatus according to an embodiment.

FIG. 7 is a schematic cross-sectional view of a portion of a display apparatus according to an embodiment. In FIG. 7, the same reference numerals as those in FIG. 3A are used to denote the same or substantially the same elements or members as those in FIG. 3A, and thus, redundant descriptions thereof may not be repeated.

Referring to FIG. 7, the display apparatus 1 (e.g., see FIG. 1) may include a first thin-film transistor TFT1, a second thin-film transistor TFT2, and a light-emitting element 200. The first thin-film transistor TFT1 may include a first active layer A1 and a first gate electrode G1, and the second thin-film transistor TFT2 may include a second active layer A2 and a second gate electrode G2.

The first active layer A1 and the second active layer A2 may each have a triple-layered structure. For example, the first active layer A1 may have a triple-layered structure including a third semiconductor material layer SCL3, a first conductor layer CL1, and a fourth semiconductor material layer SCL4. The second active layer A2 may have a triple-layered structure including a fifth semiconductor material layer SCL5, a second conductor layer CL2, and a sixth semiconductor material layer SCL6.

Hereinafter, elements included in the display apparatus 1 (e.g., see FIG. 1) will be described in more detail with reference to FIG. 7 according to a stacking order.

The substrate 100 may include a glass material, a ceramic material, a metallic material, or a flexible or bendable material. The substrate 100 may have a single-layer structure or a multi-layered structure including one or more of the above-described materials. In the case of the multi-layered structure, the substrate 100 may further include an inorganic layer. In some embodiments, the substrate 100 may have a structure (e.g., a stacked structure) of an organic material/inorganic material/organic material.

The buffer layer 111 may be arranged on the substrate 100, and in some embodiments, the barrier layer may be further included between the substrate 100 and the buffer layer 111. In some embodiments, the bottom metal layer may be arranged between the barrier layer and the buffer layer 111. The bottom metal layer may include a conductive material including, for example, Mo, Al, Cu, Ti, or the like, and may have a single-layer structure or a multi-layered structure including one or more of the above materials.

The first active layer A1 and the second active layer A2 may be located on the buffer layer 111. The first active layer A1 may include the third semiconductor material layer SCL3, the first conductor layer CL1, and the fourth semiconductor material layer SCL4. The second active layer A2 may include the fifth semiconductor material layer SCL5, the second conductor layer CL2, and the sixth semiconductor material layer SCL6. The first active layer A1 and the second active layer A2 may each have a structure (e.g., a stacked structure) of a semiconductor layer/conductor layer/semiconductor layer.

The third to sixth semiconductor material layers SCL3 to SCL6 may each include an oxide semiconductor material. For example, the third to sixth semiconductor material layers SCL3 to SCL6 may each include an oxide of at least one material selected from the group consisting of In, Ga, Sn, Zr, V, Hf, Cd, Ge, Cr, Ti, Al, Cs, Ce, and Zn. As an example, the third to sixth semiconductor material layers SCL3 to SCL6 may each be an ITZO semiconductor layer, an IGZO semiconductor layer, or the like.

As another example, the third to sixth semiconductor material layers SCL3 to SCL6 may each include a material denoted by $M1_a M2_b M3_c M4_d O_x$. Here, M1 may be In, M2 may be Sn, M4 may be Zn, and M3 may be Ga, Mg, Hf, or Ti having a high binding energy with oxygen. b may be a real number between 0 and 5, a, c, and d may be real numbers between 0 and 2, and x may be any suitable real number. For example, the third to sixth semiconductor material layers SCL3 to SCL6 may each be an ITZO semiconductor layer, an InSnGaZnO semiconductor layer, an InSnTiZnO semiconductor layer, or the like.

The first conductor layer CL1 may be between the third and fourth semiconductor material layers SCL3 and SCL4, and the second conductor layer CL2 may be between the fifth and sixth semiconductor material layers SCL5 and SCL6. The first and second conductor layers CL1 and CL2 may each include a metal element, for example, such as Al, Pt, Pd, Ag, Mg, Au, Ni, Nd, Ir, Cr, Li, Ca, Mo, Ti, W, Cu, Nb, and/or the like. The first and second conductor layers CL1 and CL2 may each include a metal or a metal compound having a suitable resistance of about 350 μΩcm to about 990 μΩcm. As an example, the first and second conductor layers CL1 and CL2 may each include TiN, Nb, or the like.

In an embodiment, as shown in FIG. 7, the third semiconductor material layer SCL3 and the first conductor layer CL1 may have different thicknesses from each other. A thickness t4 of the third semiconductor material layer SCL3 may be greater than a thickness t5 of the first conductor layer CL1. As an example, the thickness t5 of the first conductor layer CL1 may be about 30 Å to about 60 Å, and the thickness t4 of the third semiconductor material layer SCL3 may be about 100 Å to about 200 Å. Although the third semiconductor material layer SCL3 is described in more detail, the same or substantially the same applies to the fourth semiconductor material layer SCL4. In other words, a thickness t6 of the fourth semiconductor material layer SCL4 may be greater than the thickness t5 of the first conductor layer CL1.

The fifth semiconductor material layer SCL5 and the second conductor layer CL2 may have different thicknesses from each other. A thickness t7 of the fifth semiconductor material layer SCL5 may be greater than a thickness t8 of the second conductor layer CL2. As an example, the thickness t8 of the second conductor layer CL2 may be about 30 Å to about 60 Å, and the thickness t7 of the fifth semiconductor material layer SCL5 may be about 100 Å to about 200 Å. Although the fifth semiconductor material layer SCL5 is described in more detail, the same or substantially the same applies to the sixth semiconductor layer SCL6. In other words, a thickness t9 of the sixth semiconductor layer SCL6 may be greater than the thickness t8 of the second conductor layer CL2.

Gate insulating layers GI may be arranged on the first and second active layers A1 and A2, respectively. In an embodiment, as shown in FIG. 7, the gate insulating layers GI may be patterned to overlap with portions of the first and second active layers A1 and A2, respectively. As another example, the gate insulating layers GI may not be patterned to overlap with portions of the first and second active layers A1 and A2, respectively, and may be arranged on the entire or substantially the entire surface of the substrate 100 to cover the first and second active layers A1 and A2. In this case, the gate insulating layers GI may be formed as one gate insulating layer GI that covers both the first and second active layers A1 and A2.

The first gate electrode G1 and the second gate electrode G2 may be arranged on the gate insulating layers GI to at least partially overlap with the first and second active layers A1 and A2, respectively. The first and second gate electrodes G1 and G2 may include a single layer or multi-layers of one or more metals selected from the group consisting of Al, Pt, Pd, Ag, Mg, Au, Ni, Nd, Ir, Cr, Li, Ca, Mo, Ti, W, and Cu.

In an embodiment, the storage capacitor Cst includes a first electrode CE1 and a second electrode CE2. As shown in FIG. 7, the first electrode CE1 of the storage capacitor Cst may include the same material as that of the first and second gate electrodes G1 and G2 of the first and second thin-film transistors TFT1 and TFT2.

In another embodiment, the first gate electrode G1 of the first thin-film transistor TFT1 may function as the first electrode CE1 of the storage capacitor Cst. In this case, the second electrode CE2 of the storage capacitor Cst may overlap with the first gate electrode G1 of the first thin-film transistor TFT1 functioning as the first electrode CE1 of the storage capacitor Cst.

A first insulating layer IL1 may be provided to cover the first and second active layers A1 and A2, the first and second gate electrodes G1 and G2, and the first electrode CE1 of the storage capacitor Cst. The first insulating layer IL1 may include, for example, $SiO_2$, $SiN_x$, SiON, $Al_2O_3$, $TiO_2$, $Ta_2O_5$, $HfO_2$, or $ZnO_2$.

The second electrode CE2 of the storage capacitor Cst, a first electrode layer E1, a second electrode layer E2, and a second insulating layer IL2 may be arranged on the first insulating layer IL1. A light-emitting element 200 may be arranged on the second insulating layer IL2.

The second electrode CE2 of the storage capacitor Cst and the first and second electrode layers E1 and E2 may include a single layer or multi-layers of one or more metals selected from the group consisting of Al, Pt, Pd, Ag, Mg, Au, Ni, Nd, Ir, Cr, Li, Ca, Mo, Ti, W, and Cu. In an embodiment, the second electrode CE2 of the storage capacitor Cst and the first and second electrode layers E1 and E2 may include a single Mo layer or multi-layers of Mo/Al/Mo.

The second electrode CE2 of the storage capacitor Cst may overlap with the first electrode CE1 with the first insulating layer IL1 therebetween to form a capacitance. In this case, the first insulating layer IL1 may function as a dielectric layer of the storage capacitor Cst. Although FIG. 7 shows that the second electrode CE2 of the storage capacitor Cst is arranged on the first insulating layer IL1, the present disclosure is not limited thereto, and in another embodiment, for example, the second electrode CE2 of the storage capacitor Cst may be arranged on the second insulating layer IL2. In this case, the first and second insulating layers IL1 and IL2 may function as dielectric layers of the storage capacitor Cst.

The second insulating layer IL2 may include a single layer or multi-layers including an organic material, and may provide a flat or substantially flat top surface. The second insulating layer IL2 may include a general-purpose polymer (e.g., BCB, polyimide, HMDSO, polymethylmethacrylate (PMMA), or polystyrene (PS)), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The light-emitting element 200 may be arranged on the second insulating layer IL2. The light-emitting element 200 may include a pixel electrode 210, an intermediate layer 220, and an opposite electrode 230.

The pixel electrode 210 may be a (semi-)transmissive electrode or a reflective electrode. In some embodiments, the pixel electrode 210 may include a reflective layer including, for example, Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may include ITO/Ag/ITO.

The pixel electrode 210 of the light-emitting element 200 may be connected to the first active layer A1 through contact holes penetrating the first and second insulating layers IL1 and IL2, respectively, to expose a portion of the first active layer A1.

A pixel-defining layer PDL may be arranged on the second insulating layer IL2. In addition, the pixel-defining layer PDL may prevent or substantially prevent arcs from occurring at an edge of the pixel electrode 210 by increasing a distance between the edge of the pixel electrode 210 and the opposite electrode 230, which may be on top of the pixel electrode 210.

The pixel-defining layer PDL includes at least one organic insulating material selected from the group consisting of polyimide, polyamide, acrylic resin, benzocyclobutene, and phenol resin, and may be formed by a suitable method, for example, such as spin coating.

The intermediate layer 220 of the light-emitting element 200 may include an organic emission layer. The organic emission layer may include an organic material including a fluorescent material or a phosphorescent material that emits, for example, red, green, blue, or white light. The organic emission layer may be a low-molecular weight organic material or a polymer organic material. Below and/or above the organic emission layer, various suitable functional layers, for example, such as a hole transport layer (HTL), a hole injection layer (HIL), an electron transport layer (ETL), and/or an electron injection layer (EIL), may be selectively arranged as needed or desired. The intermediate layer 220 may be arranged to correspond to each of a plurality of pixel electrodes 210. However, the present disclosure is not limited thereto. For example, the intermediate layer 220 may include an integral layer over the pixel electrodes 210. Various suitable modifications are possible, as would be understood by a person having ordinary skill in the art.

The opposite electrode 230 may be a transmissive electrode or a reflective electrode. In some embodiments, the opposite electrode 230 may be a transparent or translucent electrode, and may include a metal thin film having a small work function, including Li, Ca, lithium fluoride (LiF)/Ca, LiF/Al, Al, Ag, Mg, and/or a compound thereof. In addition, a transparent conductive oxide (TCO) layer, for example, such as ITO, IZO, ZnO, or $In_2O_3$, may be further arranged on the metal thin film. The opposite electrode 230 may be arranged over the display area DA (e.g., see FIG. 1), and may be arranged on the intermediate layer 220 and the pixel-defining layer PDL. The opposite electrode 230 may be formed as one body (e.g., as a integral layer) with respect to a plurality of light-emitting elements 200, and may correspond to the plurality of pixel electrodes 210.

In some embodiments, a capping layer may be arranged above the opposite electrode 230. The capping layer may be configured to protect the opposite electrode 230, and to increase light extraction efficiency. For example, the capping layer may include a material having a refractive index of about 1.2 to about 3.1. In addition, the capping layer may include an organic material. However, the present disclosure is not limited thereto, and the capping layer may be omitted.

The display apparatus 1 according to an embodiment may include the first thin-film transistor TFT1 including the first active layer A1 and the first gate electrode G1, and the second thin-film transistor TFT2 including the second active layer A2 and the second gate electrode G2. The first active layer A1 and the second active layer A2 may each have the triple-layered structure including oxide semiconductor material layers and first and second conductor layers CL1 and CL2. In this case, as shown in FIGS. 4 to 6, the first and second active layers A1 and A2 may have a high carrier mobility, and the first and second thin-film transistors TFT1 and TFT2 may function as switches.

Figure 8:
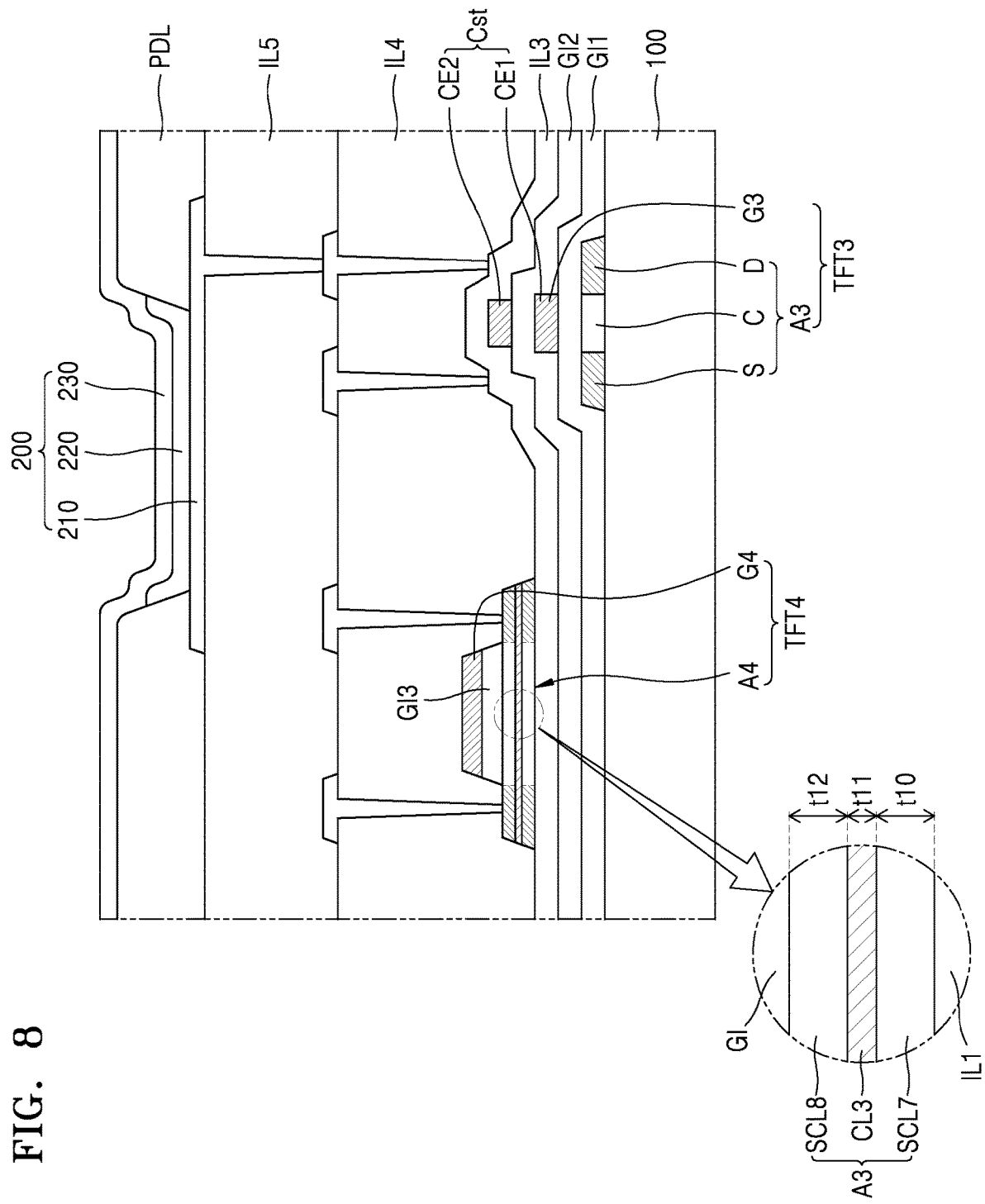
FIG. 8 is a schematic cross-sectional view of a portion of a display apparatus according to an embodiment.

FIG. 8 is a schematic cross-sectional view of a display apparatus according to an embodiment. In FIG. 8, the same reference numerals as those in FIG. 7 are used to denote the same or substantially the same elements or members as those in FIG. 7, and thus, redundant descriptions thereof may not be repeated.

Referring to FIG. 8, the display apparatus 1 (e.g., see FIG. 1) may include a third thin-film transistor TFT3, a fourth thin-film transistor TFT4, and a light-emitting element 200. The third thin-film transistor TFT3 may include a third active layer A3 and a third gate electrode G3, and the fourth thin-film transistor TFT4 may include a fourth active layer A4 and a fourth gate electrode G4.

The third active layer A3 may include a single layer, and the fourth active layer A4 may have a triple-layered structure. For example, the fourth active layer A4 may have a triple-layered structure including a seventh semiconductor material layer SCL7, a third conductor layer CL3, and an eighth semiconductor material layer SCL8.

Hereinafter, elements included in the display apparatus 1 (e.g., see FIG. 1) will be described in more detail with reference to FIG. 8 according to a stacking order.

The substrate 100 may include a glass material, a ceramic material, a metallic material, or a flexible or bendable material. The buffer layer 111 may be arranged on the substrate 100, and in some embodiments, the barrier layer may be further included between the substrate 100 and the buffer layer 111. In some embodiments, the bottom metal layer may be arranged between the barrier layer and the buffer layer 111.

The third active layer A3 may be arranged on the buffer layer 111. The third active layer A3 may include amorphous silicon or polysilicon. The third active layer A3 may include a channel area C, and a source area S and a drain area D arranged at opposite sides of the channel area C. As shown in FIG. 8, the third active layer A3 may include a single layer. As another example, the third active layer A3 may include multi-layers.

A first gate insulating layer GI1 and a second gate insulating layer GI2 may be stacked and arranged on the substrate 100 to cover the third active layer A3. The first gate insulating layer GI1 and the second gate insulating layer GI2 may each include $SiO_2$, $SiN_x$, $SiON$, $Al_2O_3$, $TiO_2$, $Ta_2O_5$, $HfO_2$, or $ZnO_2$.

The third gate electrode G3 may be arranged on the first gate insulating layer GI1 to at least partially overlap with the third active layer A3. Although FIG. 8 shows that the third gate electrode G3 is arranged on the first gate insulating layer GI1, in another embodiment, the third gate electrode G3 may be arranged on an upper surface of the second gate insulating layer GI2.

In an embodiment, the storage capacitor Cst may include the first electrode CE1 and the second electrode CE2, and may overlap with the third thin-film transistor TFT3 as shown in FIG. 8. For example, the third gate electrode G3 of the third thin-film transistor TFT3 may function as the first electrode CE1 of the storage capacitor Cst. In another embodiment, the storage capacitor Cst may not overlap with the third thin-film transistor TFT3, and may be formed separately from the third thin-film transistor TFT3.

The second electrode CE2 of the storage capacitor Cst overlaps with the first electrode CE1 with the second gate insulating layer GI2 therebetween, and forms a capacitance. In this case, the second gate insulating layer GI2 may function as a dielectric layer of the storage capacitor Cst.

A third insulating layer IL3 and a fourth insulating layer IL4 may be provided on the second gate insulating layer GI2 to cover the second electrode CE2 of the storage capacitor Cst. The third and fourth insulating layers IL3 and IL4 may each include $SiO_2$, $SiN_x$, SiON, $Al_2O_3$, $TiO_2$, $Ta_2O_5$, $HfO_2$, or $ZnO_2$.

The fourth active layer A4 may be arranged on the third insulating layer IL3. The fourth active layer A4 may include the seventh semiconductor material layer SCL7, the third conductor layer CL3, and the eighth semiconductor material layer SCL8. The fourth active layer A4 may have a structure (e.g., a stacked structure) of a semiconductor layer/conductor layer/semiconductor layer.

The seventh and eighth semiconductor material layers SCL7 and SCL8 may each include an oxide semiconductor material. The seventh and eighth semiconductor material layers SCL7 and SCL8 may each include an oxide of at least one material selected from the group consisting of In, Ga, Sn, Zr, V, Hf, Cd, Ge, Cr, Ti, Al, Cs, Ce, and Zn. As an example, the seventh and eighth semiconductor material layers SCL7 and SCL8 may each be an ITZO semiconductor layer, an IGZO semiconductor layer, or the like.

As another example, the seventh and eighth semiconductor material layers SCL7 and SCL8 may each include a material denoted by $M1_aM2_bM3_cM4_dO_x$. Here, M1 may be In, M2 may be Sn, M4 may be Zn, and M3 may be Ga, Mg, Hf, or Ti having a high binding energy with oxygen. b may be a real number between 0 and 5, a, c, and d may be real numbers between 0 and 2, and x may be any suitable real number. For example, the seventh and eighth semiconductor material layers SCL7 and SCL8 may each be an ITZO semiconductor layer, an InSnGaZnO semiconductor layer, an InSnTiZnO semiconductor layer, or the like.

The third conductor layer CL3 may be between the seventh and eighth semiconductor material layers SCL7 and SCL8. The third conductor layer CL3 may include a metal element, for example, such as Al, Pt, Pd, Ag, Mg, Au, Ni, Nd, Ir, Cr, Li, Ca, Mo, Ti, W, Cu, Nb, and/or the like. The third conductor layer CL3 may include a metal or a metal compound having a suitable resistance of about 350 μΩcm to about 990 μΩcm. As an example, the third conductor layer CL3 may include TiN, Nb, or the like.

In an embodiment, as shown in FIG. 8, the seventh semiconductor material layer SCL7 and the third conductor layer CL3 may have different thicknesses from each other. A thickness t10 of the seventh semiconductor material layer SCL7 may be greater than a thickness t11 of the third conductor layer CL3. As an example, the thickness t11 of the third conductor layer CL3 may be about 30 Å to about 60 Å, and the thickness t10 of the seventh semiconductor material layer SCL7 may be about 100 Å to about 200 Å. Although the seventh semiconductor material layer SCL7 is described in more detail, the same or substantially the same applies to the eighth semiconductor material layer SCL8. In other words, a thickness t12 of the eighth semiconductor material layer SCL8 may be greater than the thickness t11 of the third conductor layer CL3.

A third gate insulating layer GI3 may be arranged on the fourth active layer A4. In an embodiment, as shown in FIG. 8, the third gate insulating layer GI3 may be patterned to overlap with a portion of the fourth active layer A4. As another example, the third gate insulating layer GI3 may not be patterned to overlap with a portion of the fourth active layer A4, and may be arranged on the entire or substantially the entire surface of the substrate 100 to cover the fourth active layer A4.

The fourth gate electrode G4 may be arranged on the third gate insulating layer GI3 to at least partially overlap with the fourth active layer A4. The fourth gate electrode G4 may include a single layer or multi-layers of one or more metals selected from the group consisting of Al, Pt, Pd, Ag, Mg, Au, Ni, Nd, Ir, Cr, Li, Ca, Mo, Ti, W, and Cu.

A fifth insulating layer IL5 may be arranged on the fourth insulating layer IL4. The fifth insulating layer IL5 may include a single layer or multi-layers including an organic material, and may provide a flat or substantially flat top surface. The fifth insulating layer IL5 may include a general-purpose polymer (e.g., BCB, polyimide, HMDSO, PMMA, or PS), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A light-emitting element 200 may be arranged on the fifth insulating layer IL5. The light-emitting element 200 may include a pixel electrode 210, an intermediate layer 220, and an opposite electrode 230.

A pixel-defining layer PDL may be arranged on the fifth insulating layer IL5. In addition, the pixel-defining layer PDL may prevent or substantially prevent arcs from occurring at an edge of the pixel electrode 210 by increasing a distance between the edge of the pixel electrode 210 and the opposite electrode 230, which may be on top of the pixel electrode 210.

The display apparatus 1 according to an embodiment may include the third thin-film transistor TFT3 including the third active layer A3 and the third gate electrode G3, and the fourth thin-film transistor TFT4 including the fourth active layer A4 and the fourth gate electrode G4. The third active layer A3 may include a silicon semiconductor material, and the fourth active layer A4 may have the triple-layered structure including oxide semiconductor material layers and the third conductor layer CL3. In this case, as shown in FIGS. 4 to 6, the fourth active layer A4 may have a high carrier mobility, and the fourth thin-film transistor TFT4 may function as a switch through the fourth active layer A4.

Figure 9:
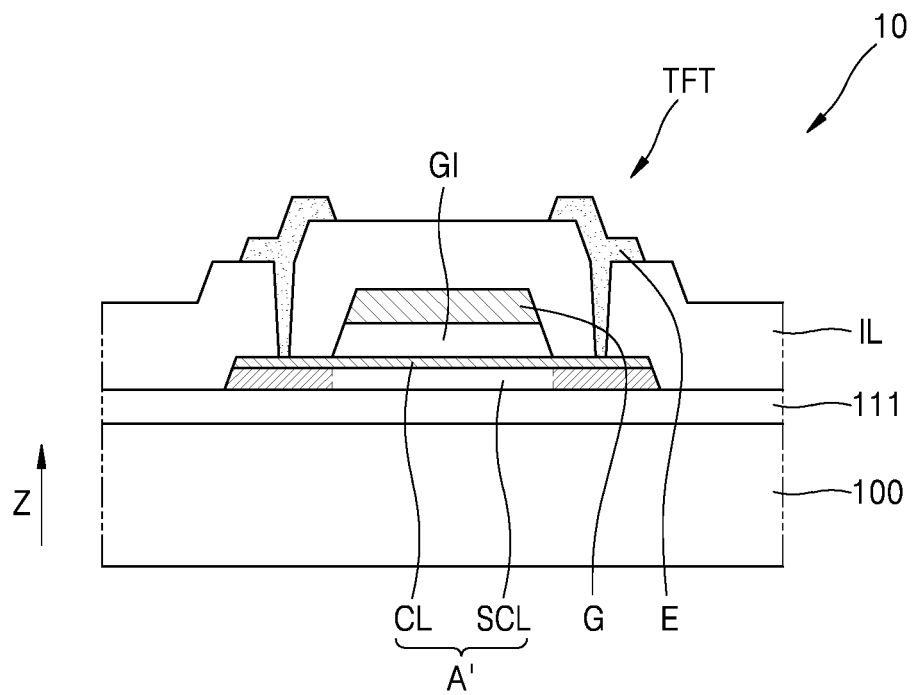
FIG. 9 is a schematic cross-sectional view of a portion of a thin-film transistor substrate according to an embodiment.

FIG. 9 is a schematic cross-sectional view of a portion of a thin-film transistor substrate 10 according to an embodiment. In FIG. 9, the same reference numerals as those in FIG. 3A are used to denote the same or substantially the same elements or members as those in FIG. 3A, and thus, redundant descriptions thereof may not be repeated.

Referring to FIG. 9, the thin-film transistor substrate 10 may include a thin-film transistor TFT including an active layer A' and a gate electrode G. In this case, the active layer A' may have a double-layered structure. For example, the active layer A' may have a double-layered structure including a semiconductor material layer SCL and a conductor layer CL.

Although FIG. 9 shows that the conductor layer CL is arranged on the semiconductor material layer SCL, a stacking order thereof may be modified. For example, in other embodiments, the semiconductor material layer SCL may be arranged on the conductor layer CL.

In an embodiment, a thickness of the semiconductor material layer SCL may be greater than a thickness of the conductor layer CL.

The semiconductor material layer SCL may include an oxide semiconductor material. The semiconductor material layer SCL may include an oxide of at least one material selected from the group consisting of In, Ga, Sn, Zr, V, Hf, Cd, Ge, Cr, Ti, Al, Cs, Ce, and Zn. As an example, the semiconductor material layer SCL may be an ITZO semiconductor layer, an IGZO semiconductor layer, or the like.

The conductor layer CL may include a metal element, for example, such as Al, Pt, Pd, Ag, Mg, Au, Ni, Nd, Ir, Cr, Li, Ca, Mo, Ti, W, Cu, Nb, and/or the like. The conductor layer CL may include a metal or a metal compound having a suitable resistance of about 350 μΩcm to about 990 μΩcm. As an example, the conductor layer CL may include TiN, Nb, or the like.

The thin-film transistor substrate 10 according to an embodiment may include the thin-film transistor TFT including the active layer A' and the gate electrode G. The active layer A' may have a double-layered structure including the semiconductor material layer SCL and the conductor layer CL. Even in this case, the thin-film transistor TFT may function as a switch through the active layer A'.

While a structure of the thin-film transistor substrate and the display apparatus have been mainly described, the present disclosure is not limited thereto. For example, a method of manufacturing the thin-film transistor substrate according to one or more example embodiments, and a method of manufacturing a display apparatus including the thin-film transistor substrate according to one or more example embodiments may also fall within the scope of the present disclosure.

According to one or more example embodiments of the present disclosure described above, a thin-film transistor substrate in which carrier mobility of a thin-film transistor is increased, and a display apparatus including the same has been described. However, the spirit and scope of the present disclosure is not limited to such aspects and features.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A thin-film transistor substrate comprising:
    an active layer on a substrate, the active layer comprising:
        a first semiconductor material layer;
        a conductor layer on the first semiconductor material layer, and consisting a metal; and
        a second semiconductor material layer on the conductor layer;
    a gate insulating layer on the active layer; and
    a gate electrode on the gate insulating layer, and at least partially overlapping with the active layer.

2. The thin-film transistor substrate of claim 1, wherein at least one of the first semiconductor material layer or the second semiconductor material layer comprises an oxide semiconductor material.

3. The thin-film transistor substrate of claim 2, wherein the first semiconductor material layer and the second semiconductor material layer each comprises at least one of an InSnZnO (ITZO) semiconductor layer, an InSnGaZnO semiconductor layer, or an InSnTiZnO semiconductor layer.

4. The thin-film transistor substrate of claim 1, wherein a thickness of at least one of the first semiconductor material layer or the second semiconductor material layer is greater than a thickness of the conductor layer.

5. The thin-film transistor substrate of claim 1, wherein a thickness of the conductor layer is about 30 Å to about 60 Å.

6. A display apparatus comprising:
    a first thin-film transistor on a substrate, and comprising a first active layer and a first gate electrode; and
    a light-emitting element electrically connected to the first thin-film transistor,
    wherein the first active layer comprises:
        a first semiconductor material layer;
        a first conductor layer on the first semiconductor material layer, and consisting a metal; and
        a second semiconductor material layer on the first conductor layer.

7. The display apparatus of claim 6, wherein a thickness of at least one of the first semiconductor material layer or the second semiconductor material layer is greater than a thickness of the first conductor layer.

8. The display apparatus of claim 6, further comprising a second thin-film transistor on the substrate, and comprising a second active layer and a second gate electrode.

9. The display apparatus of claim 8, wherein the second active layer comprises:
    a third semiconductor material layer;
    a second conductor layer on the third semiconductor material layer, and comprising a metal element; and
    a fourth semiconductor material layer on the second conductor layer.

10. The display apparatus of claim 9, wherein a thickness of at least one of the third semiconductor material layer or the fourth semiconductor material layer is greater than a thickness of the second conductor layer.

11. The display apparatus of claim 9, wherein a thickness of at least one of the first conductor layer or the second conductor layer is about 30 Å to about 60 Å.

12. The display apparatus of claim 9, wherein at least one of the first to fourth semiconductor material layers comprises an oxide semiconductor material.

13. The display apparatus of claim 12, wherein the first semiconductor material layer and the second semiconductor material layer each comprises at least one of an ITZO semiconductor layer, an InSnGaZnO semiconductor layer, or an InSnTiZnO semiconductor layer.

14. The display apparatus of claim 8, wherein the second active layer comprises a single layer.

15. The display apparatus of claim 8, wherein the second active layer comprises a silicon semiconductor material.

16. The display apparatus of claim 8, further comprising:
    a storage capacitor on the substrate, and comprising a first electrode and a second electrode that overlap with each other; and
    a driving voltage line electrically connected to the storage capacitor,
    wherein the storage capacitor is configured to store a voltage corresponding to a difference between a first voltage applied to the driving voltage line and a second voltage applied to the second thin-film transistor.

17. A thin-film transistor substrate comprising:
    an active layer on a substrate, and comprising a semiconductor material layer, and a conductor layer consisting of a metal;

a gate insulating layer on the active layer; and a gate electrode on the gate insulating layer in a first direction, and at least partially overlapping with the active layer, wherein the conductor layer directly contacts the gate insulating layer, and overlaps with the gate electrode in the first direction.

18. The thin-film transistor substrate of claim 17, wherein the conductor layer is on the semiconductor material layer.

19. The thin-film transistor substrate of claim 17, wherein a thickness of the semiconductor material layer is greater than a thickness of the conductor layer.

20. The thin-film transistor substrate of claim 17, wherein the semiconductor material layer comprises an oxide semiconductor material.

* * * * *